United States Patent
Hemmenway et al.

(10) Patent No.: US 6,812,108 B2
(45) Date of Patent: Nov. 2, 2004

(54) BICMOS PROCESS WITH LOW TEMPERATURE COEFFICIENT RESISTOR (TCRL)

(75) Inventors: Donald Hemmenway, Melbourne, FL (US); Jose Delgado, Valkaria, FL (US); John Butler, Palm Bay, FL (US); Anthony Rivoli, Palm Bay, FL (US); Michael D. Church, Sebastian, FL (US); George V. Rouse, Indialantic, FL (US); Lawrence G. Pearce, Palm Bay, FL (US); George Bajor, Melbourne, FL (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 10/393,181

(22) Filed: Mar. 19, 2003

(65) Prior Publication Data

US 2003/0157778 A1 Aug. 21, 2003

Related U.S. Application Data

(60) Division of application No. 09/607,080, filed on Jun. 29, 2000, which is a continuation-in-part of application No. 09/345,929, filed on Jul. 1, 1999, now Pat. No. 6,351,021.

(51) Int. Cl.$^7$ ............................................. H01L 21/20
(52) U.S. Cl. ..................... 438/385; 438/330; 438/382
(58) Field of Search ............................... 438/330, 384, 438/385, 382

(56) References Cited

U.S. PATENT DOCUMENTS

| | | | |
|---|---|---|---|
| 4,512,815 A | 4/1985 | Khadder et al. | |
| 4,512,816 A | 4/1985 | Ramde et al. | |
| 4,672,416 A | 6/1987 | Nakazato et al. | |
| 4,674,173 A | 6/1987 | Hahn et al. | |

(List continued on next page.)

FOREIGN PATENT DOCUMENTS

JP      405335558      12/1993

OTHER PUBLICATIONS

Butler, John et al., "Integration of a High Q Spiral Inductor Into an Existing Digital CMOS Backend", Harris Semiconductor, Melbourne Florida, pp. 1–3.

Delgato, Jose A. et al, "Development and Characterization of a Precision Polysilicon Resistor for Wireless Applications", Harris Semiconductor, Melbourne Florida, pp. 1–3.

(List continued on next page.)

Primary Examiner—John F. Niebling
Assistant Examiner—Christopher Lattin
(74) Attorney, Agent, or Firm—Fogg and Associates, LLC; Scott V. Lundberg

(57) ABSTRACT

A low temperature coefficient resistor(TCRL) has some unrepaired ion implant damage. The damaged portion raises the resistance and renders the resistor less sensitive to operating temperature fluctuations. A polysilicon thin film low temperature coefficient resistor and a method for the resistor's fabrication overcomes the coefficient of resistance problem of the prior art, while at the same time eliminating steps from the BiCMOS fabrication process, optimizing bipolar design tradeoffs, and improving passive device isolation. A low temperature coefficient of resistance resistor (TCRL) is formed on a layer of insulation, typically silicon dioxide or silicon nitride, the layer comprising polysilicon having a relatively high concentration of dopants of one or more species. An annealing process is used for the implanted resistor which is shorter than that for typical prior art implanted resistors, leaving some intentional unannealed damage in the resistor. The planned damage gives the TCRL a higher resistance without increasing its temperature coefficient. A process for fabrication of the resistor is used which combines separate spacer oxide depositions, provides buried layers having different diffusion coefficients, incorporates dual dielectric trench sidewalls that double as a polish stop, supplies a spacer structure that controls precisely the emitter-base dimension, and integrates bipolar and CMOS devices with negligible compromise to the features of either type.

41 Claims, 13 Drawing Sheets

U.S. PATENT DOCUMENTS

| | | | |
|---|---|---|---|
| 5,254,486 A | | 10/1993 | Alter |
| 5,422,298 A | | 6/1995 | Jimenez |
| 5,466,960 A | * | 11/1995 | Ilderem et al. ............. 257/369 |
| 5,481,132 A | | 1/1996 | Moreau |
| 5,489,547 A | * | 2/1996 | Erdeljac et al. ............ 438/238 |
| 5,576,572 A | | 11/1996 | Maeda et al. |
| 5,622,887 A | * | 4/1997 | Miwa et al. ................ 438/202 |
| 5,807,780 A | | 9/1998 | Davis et al. |
| 5,856,695 A | | 1/1999 | Ito et al. |
| 6,100,127 A | * | 8/2000 | Wu ............................ 438/238 |
| 6,140,910 A | * | 10/2000 | Smith et al. ................ 338/309 |
| 6,225,181 B1 | | 5/2001 | Gregory |

OTHER PUBLICATIONS

Hemmenway, Donald et al., "UHF2: A 0.6um, 25 GHz BICMOS Technology for Mixed Signal, Wireless Communications Applications", Harris Semiconductor, Melbourne, Florida 1 pg.

Hemmenway, Donald et al., UHF2: A BICMOS Technology Optimized for Low Cost, Mixed–Signal RF Applications, Harris Semiconductor, Melbourne, Florida, pp. 1–4.

* cited by examiner

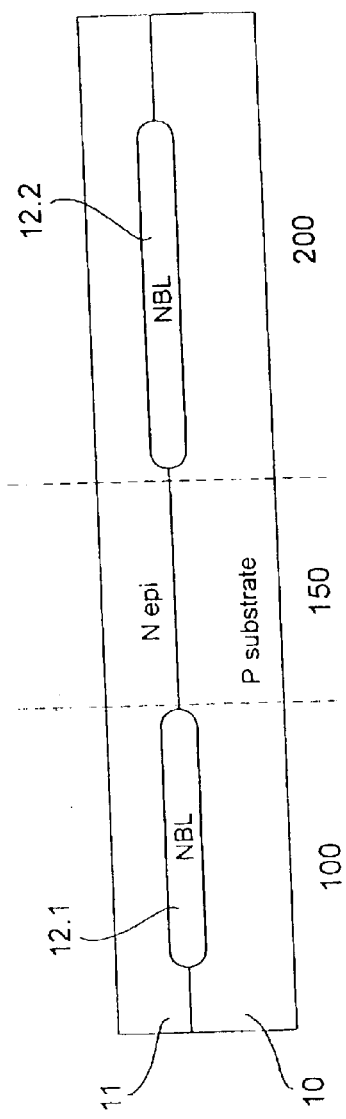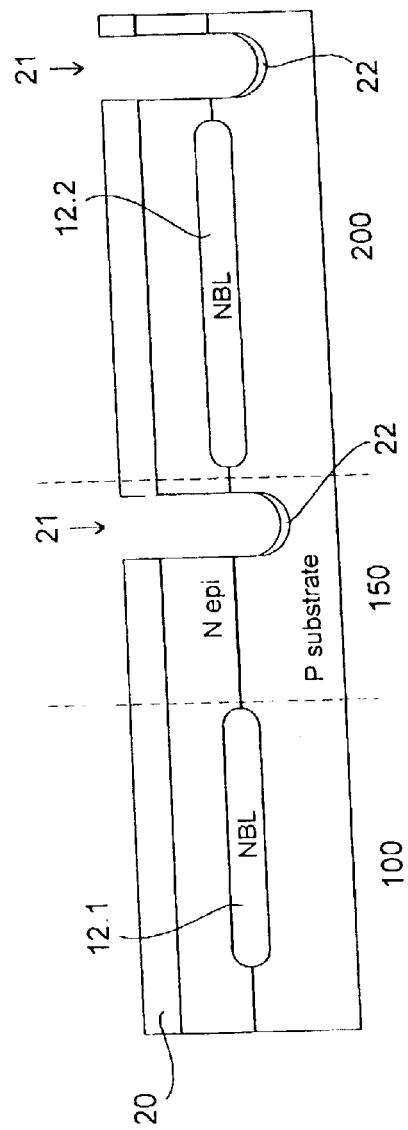

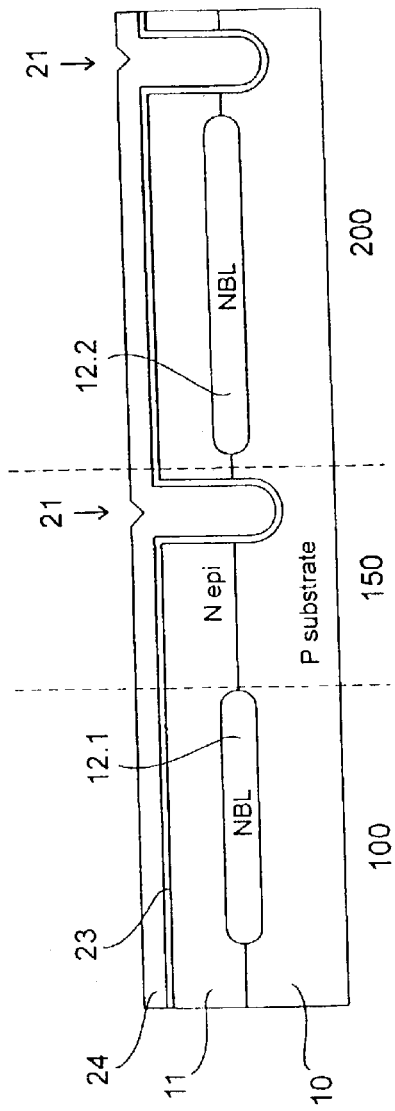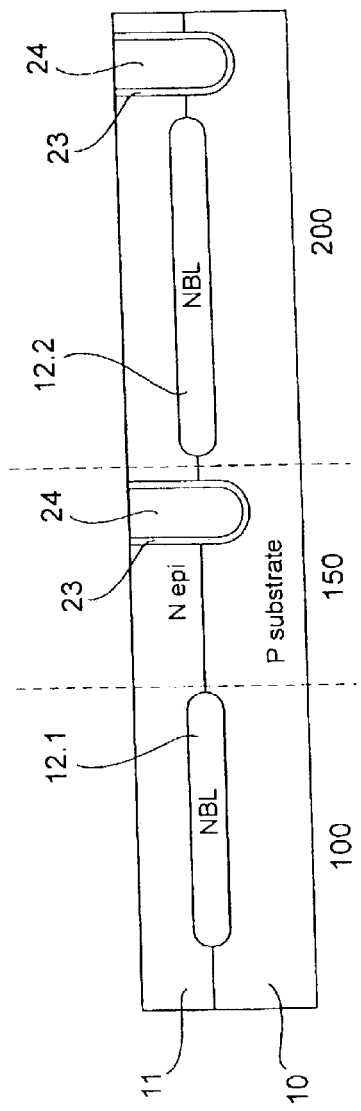

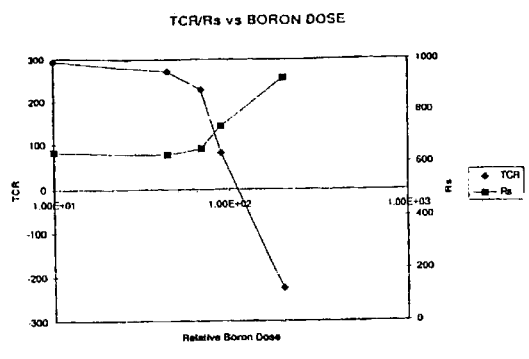
Fig. 20 TCR Changes with Boron Dose
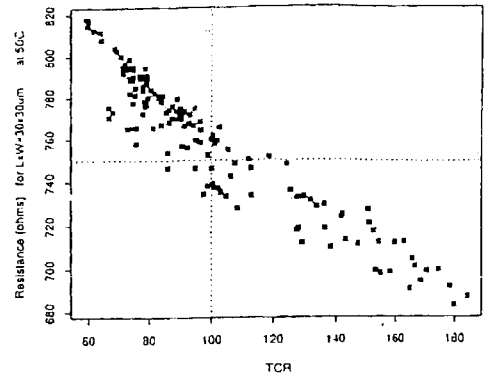
Fig. 21 Scatter Plot of TCR vs Rs
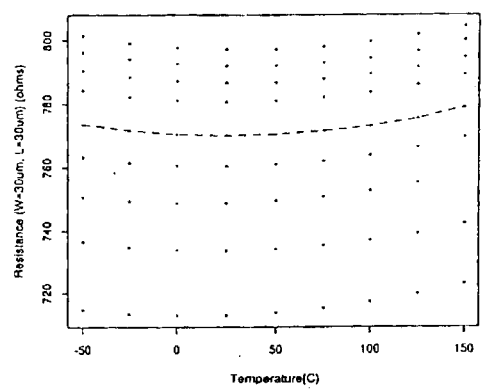
Fig. 22 Resistance Changes with Temperature
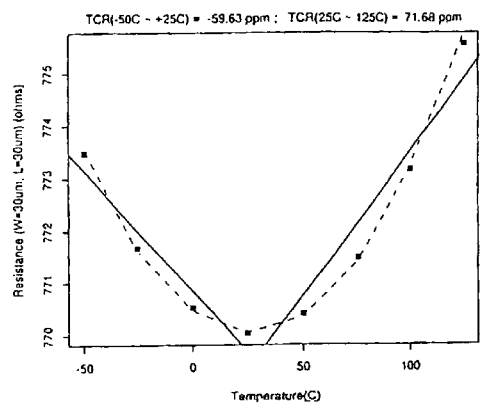
Fig. 23 TCR Changes over Temperature
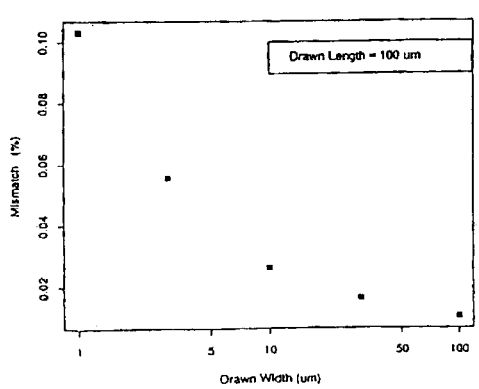
Fig. 24 Mismatch as a Function of Length
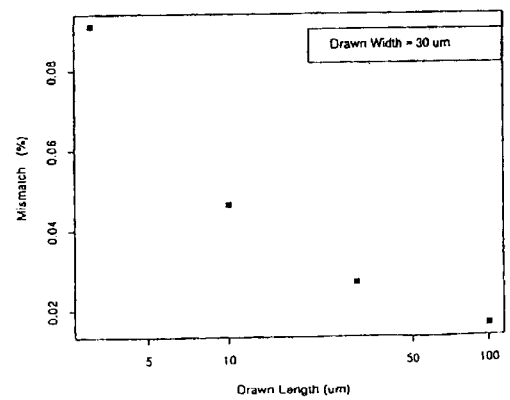
Fig. 25 Mismatch as a Function of Width

BICMOS PROCESS WITH LOW TEMPERATURE COEFFICIENT RESISTOR (TCRL)

CROSS-REFERENCE TO RELATED APPLICATIONS

This application is a divisional application of U.S. patent application Ser. No. 09/607,080, filed on Jun. 29, 2000, which is further a continuation-in-part of application Ser. No. 09/345,929 U.S. Pat. No. 6,351,021, filed Jul. 1, 1999.

BACKGROUND OF THE INVENTION

Advanced wireless communications products demand integrated circuit technologies with high performance, high levels of system integration, low power and low cost. For wireless applications up to several GHz, silicon BiCMOS technology is uniquely suited to meet these requirements. Of critical important to RF design is the availability of high quality passive components. In particular, it is desirable to have implanted thin film resistors that have a low temperature coefficient of resistance. Unfortunately, existing techniques for polysilicon thin film resistors generally result in thin film resistors with relatively large temperature coefficients of resistance.

SUMMARY

The invention comprises a polysilicon thin film low temperature coefficient resistor and a method for the resistor's fabrication that overcome the coefficient of resistance problem of the prior art, while at the same time eliminating steps from the BiCMOS fabrication process, optimizing bipolar design tradeoffs, and improving passive device isolation. The low temperature coefficient of resistance resistor (TCRL) is formed on a layer of insulation, typically silicon dioxide or silicon nitride. The layer comprises polysilicon that has a relatively high concentration of dopants of one or more species, and has a substantial amount of unannealed implant damage. Contrary to prior art methods, the implanted resistor is annealed less than typical prior art implanted resistors in order to leave some planned unannealed damage in the resistor. The planned damage gives the TCRL a higher resistance without increasing its temperature coefficient. Thus, even though the temperature may increase, the relative value of the resistance remains the same. As such, the resistor is more precise than others produced with current methods, and may be used where precision requirements for high quality RF devices apply. A process for fabrication of the resistor is used which combines separate spacer oxide depositions, provides buried layers having different diffusion coefficients, incorporates dual dielectric trench sidewalls that double as a polish stop, supplies a spacer structure that controls precisely the emitter-base dimension, and integrates bipolar and CMOS devices with negligible compromise to the features of either type

DESCRIPTION OF THE DRAWINGS

In order to highlight features of the invention while showing them in their proper context, the proportions shown in the figures are not to scale.

FIGS. 1–19 show sequential process steps in the formation of a TCRL in a BiCMOS process.

FIGS. 20–25 show experimental results for the TCRL.

DETAILED DESCRIPTION OF THE INVENTION

Figure 5:
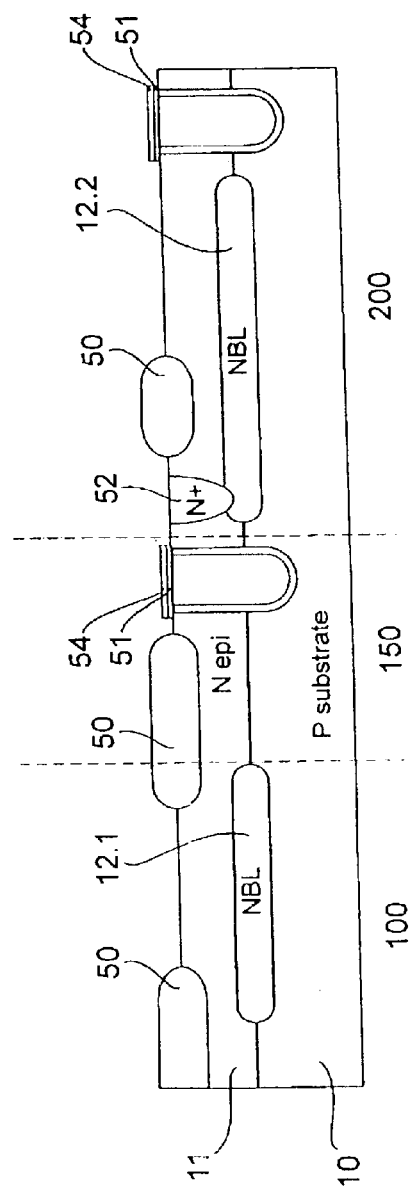

All figures show the lateral division of the regions of the substrate into CMOS regions 100, bipolar NPN regions 200, and transition regions 150 between the CMOS and bipolar regions. The regional divisions are shown by dotted lines.

Refer first to FIG. 1. A P-type substrate has its upper surface covered with a suitable ion implantation mask such as deposited oxide, thermally-grown oxide or photoresist. Openings are made in the resist mask to define the N+ buried layer regions 12.1 and 12.2. Those regions are implanted with a first N-type dopant such as Arsenic. The implantation mask is then stripped.

The substrate is then covered with a second suitable ion implantation mask such as deposited oxide, thermally-grown oxide or photoresist. Openings are made in the mask to define other buried layer regions, into which are implanted a second N-type dopant with a significantly different diffusion coefficient than the first. The two different buried layer dopants enable the fabricating of transistors with varying collector profiles, which can be tailored to address speed versus breakdown voltage tradeoffs in the RF devices. Two different collector profiles, coupled with the use of the selectively implanted collector, provide for an integrated circuit with four NPN devices.

N+ buried layers 12.1 and 12.2 are driven in with a suitable annealing operation and an N-type epitaxial layer 11 is grown on top of the substrate 10. As a result, the substrate 10 is patterned into CMOS regions 100 that are separated from bipolar NPN regions 200 by transition regions 150. The N-type buried layers 12.1 and 12.2 are formed beneath regions that will receive P-type wells. No buried layer is required for the N-type wells.

The initial trench formation step is shown in FIG. 2. Isolation trenches are formed between transition region 150 and the NPN transistor region as well as in other locations as needed for improved lateral isolation. A trench photoresist mask 20 is uniformly deposited and patterned on the substrate 10. The photoresist is developed to expose the trench regions 21. A suitable wet or dry etch operation etches the trenches 21 down to a level below the N+ buried layers 12.1 and 12.2. The bottoms of the trenches are then implanted with a suitable P+ channel stop 22.

As shown in FIG. 3, the next step includes stripping the photoresist 20, performing thermal oxidation on the trench sidewalls and depositing and patterning a sidewall dielectric layer 23 such as a nitride layer. Oxidation layer 23 is densified, providing a polish stop for planarization. Nitride in this layer has the feature of closely matching the thermal characteristics of silicon. The later is formed at a thickness which is thin enough to prevent any overhang of the trench cavity, thereby allowing complete trench fill during subsequent deposition steps. Oxidation layer 23 also provides a pad oxide for LOCOS at a later stage. The combination of thermal oxidation, nitride deposition and oxide densification allows the trench sidewall to match the thermal expansion rate of the silicon substrate.

An alternate embodiment would be to deposit the sidewall dielectric layer in such a way that would cause subsequent trench fill to form a void in the trench which is below the surface of the silicon substrate. This feature provides stress relief and eliminates silicon defect generation in the silicon adjacent the trench.

The substrate 10 is then subjected to a polysilicon deposition step that deposits a polysilicon layer 24 over the substrate 10 and epitaxial layer 11 and fills the trenches 21. The undoped polysilicon fill is a semi-insulating material, which provides a favorable electrical characteristic for RF parasitic capacitances.

FIG. 4 shows completion of the trenches. The substrate 10 and epitaxial layer 11 are planarized to remove the layers of polysilicon 24 and the thermal oxide 23 from the surface of the substrate 10 and epitaxial layer 11 in all areas except above the trenches. Such planarization is accomplished with a conventional chemical mechanical polishing operation. The nitride underneath the polysilicon serves as a hard stop during the polish operation and protects the underlying oxide and silicon from damage. The thinness of the oxide nitride sandwich also assures the precise match of the polished trench polysilicon surface to the original silicon surface.

It is important both to protect the trenches 21 and to cover the NPN region 200 during formation of the CMOS devices. Likewise, it is a goal of this process to combine as many of the CMOS and bipolar processing steps as possible. Accordingly, turning to FIG. 5, the trenches are initially protected from the subsequent CMOS processing steps. This protection includes forming a pad oxide layer 51 over the trenches. Pad oxide layer 51 is followed by an N+ sinker photoresist deposition, patterning, and implantation step to form the N+ sinker 52 for the future collector of the NPN transistors 200. Next, a layer of silicon nitride 54 is deposited over the pad oxide 51 on the surface of the substrate 10 and epitaxial layer 11. The silicon nitride is initially patterned to expose local oxidation (LOCOS) regions 50. Following LOCOS patterning, a conventional LOCOS operation fabricates LOCOS regions 50 that provide surface lateral isolation of the NMOS and PMOS devices 100 and separate the sinker diffusion 52 from the rest of the NPN transistor 200. The silicon nitride is stripped from the rest of the surface of the substrate 10 and epitaxial layer 11 except for regions above the trenches 21.

During the LOCOS operation, a 'skin' layer of silicon dioxide forms on the surface of the nitride oxidation mask. This skin layer is patterned using conventional photoresist and wet etch, leaving the skin layer over the trench regions. After photoresist removal, the nitride is removed in a suitable wet etch chemistry except for regions above the trenches 21. The use of this oxide layer allows simultaneous protection of the trench areas and removal of the nitride in a manner completely benign to the underlying pad ox and silicon substrate regions. Protection of these regions from further stress-generating thermal oxidation is important to the successful fabrication of shallow transistor structures, which follows as taught in U.S. Pat. No. 5,892,264.

The pad oxide is then removed from the surface of substrate 10 and epitaxial layer 11 to expose the surface for further fabrication.

Figure 6:
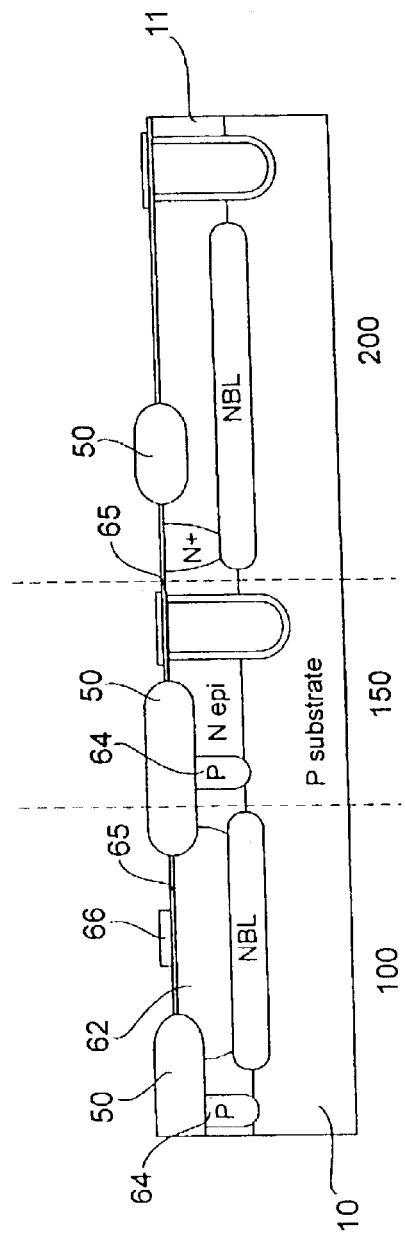

Refer now to FIG. 6. In the next step, a sacrificial oxidation is performed on the surface of epitaxial layer 11. The oxidation is atypical first step in the formation of N-wells and P-wells for the CMOS devices 100. Suitable photoresist masks and implants 62 provide the N-wells and P-wells for the CMOS devices. A heavier P-type implant 64 provides junction isolation to separate PMOS and NMOS devices. Following removal of the sacrificial oxide, a gate oxide layer 65, typically a thermal oxide, is grown on the surface of epitaxial layer 11. That step is followed by uniform deposition of a layer of polysilicon which is subsequently patterned and doped to form polysilicon gates 66.

Figure 7:
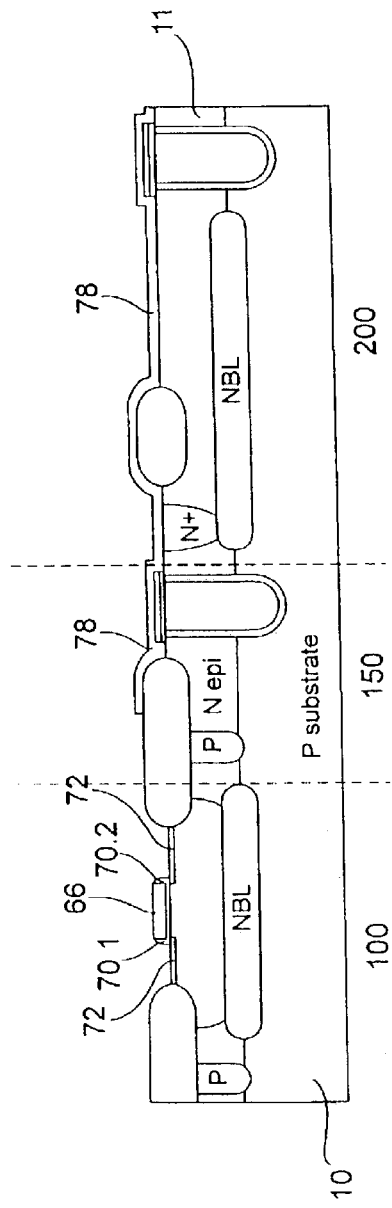

The next stage in the fabrication of the CMOS transistors is shown in FIG. 7. Next, the NMOS and PMOS drains receive a typical lightly-doped drain implant 72 (N) or (P) respectively (the P-type implant is not shown here) for forming the N-type lightly-doped drain regions and the P-type lightly-doped drain regions. An annealing step drives the lightly doped drains slightly under the sidewall of the gates. The lightly doped drain regions use the sidewalls of the gate as masks. These regions are self-aligned in a conventional manner using the gate as masks followed by suitable P-type and N-type implants. Following that step, in a region not shown in the figure, a typical P+ resistor is formed in the N-type epitaxial region 11 using a suitable photoresist and implant. Next, an NPN protection spacer oxide layer 78 is uniformly deposited over epitaxial layer 11. The spacer oxide 78 covers the transition region 150 and NPN region 200 of layer 11. Without this spacer oxide coverage, subsequent CMOS processing steps would interfere with the formation of the NPN transistor. The spacer oxide layer over the gate 66 is patterned and removed to leave sidewall spacers 70.1, 70.2 at the edges of the gate 66.

The spacer oxide layer 78 not only provides the sidewall spacers for the CMOS devices but also provides a hard mask and surface isolation for the active elements of the NPN transistor. Performing this deposition step early in the process saves one or more-deposition and masking steps later in the process. As a result, the spacer oxide layer 78 forms the mask for the self aligned sources and drains of the CMOS devices and the mask for the collector and emitter openings 126, 127, respectively. See FIG. 12 for these later process effects.

Figure 8:
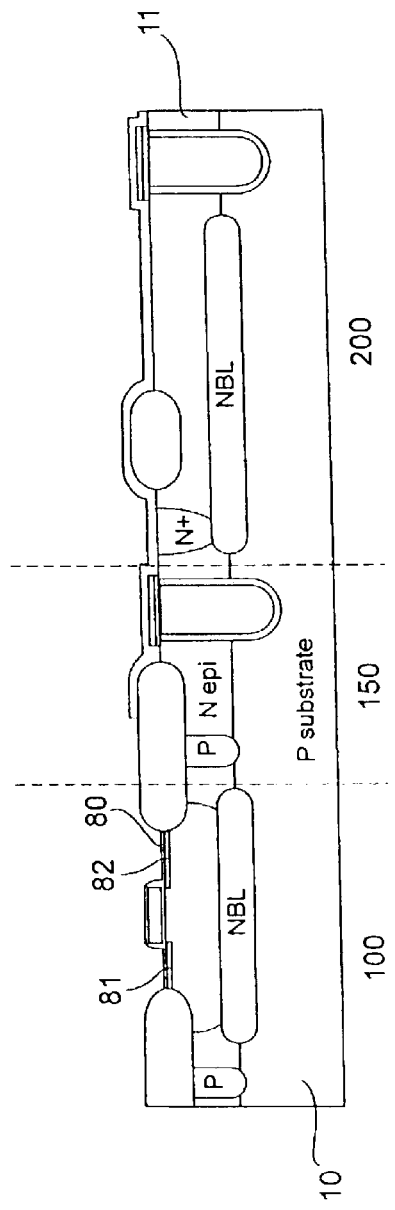
Figure 27:
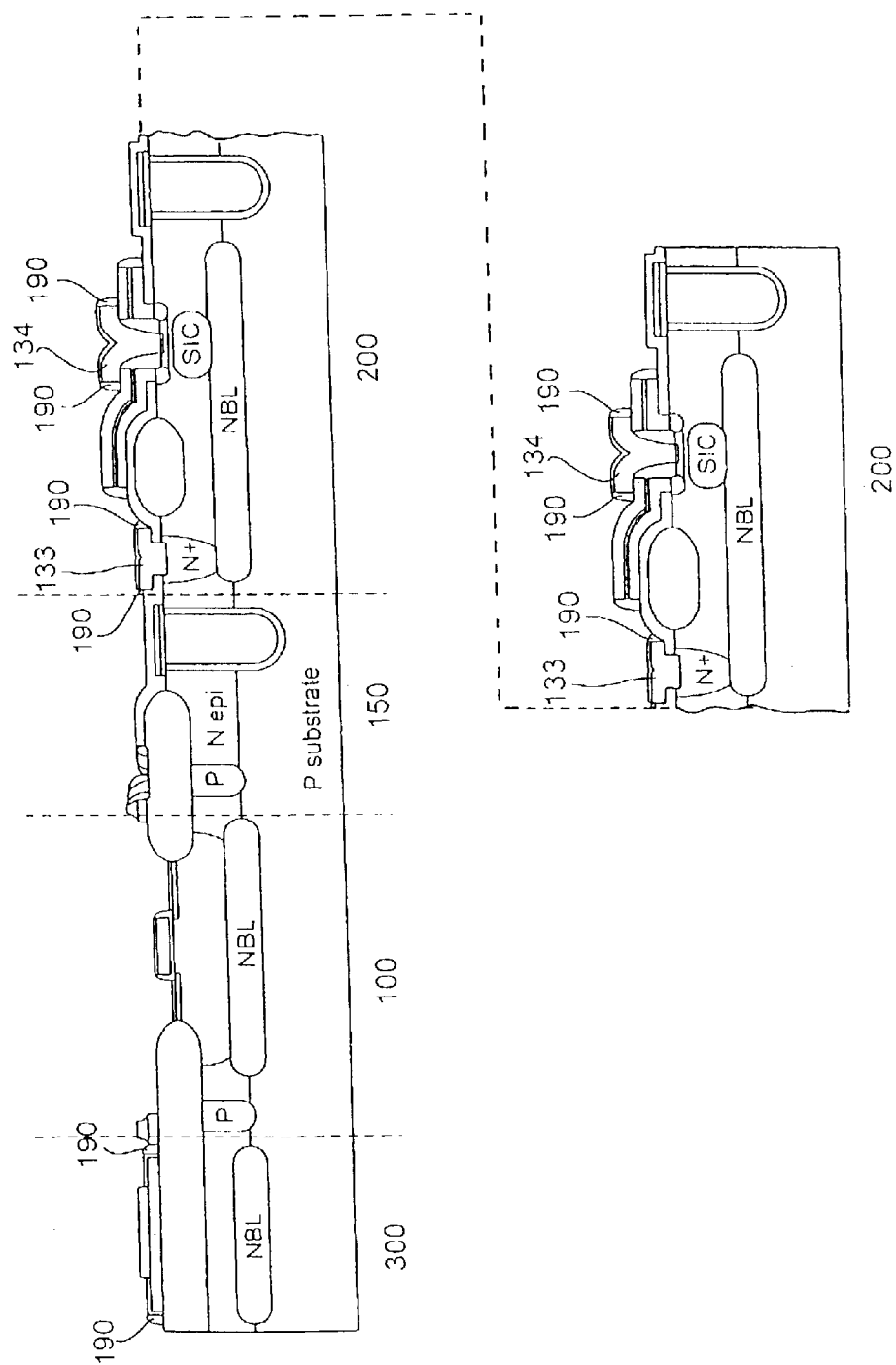
FIG. 27 shows one embodiment of the present invention that includes two bipolar devices.

The next CMOS processing step is shown in FIG. 8. A screen oxide layer 80 is deposited and patterned to cover the lightly doped source and drain regions of the CMOS device. Those regions are then suitably implanted with either P+ or N+ ions to form sources 81 and drains 82 The respective P-type and N-type sources and drains are then subjected to an annealing operation where the diffusion time is set to adjust the depth of the sources and drains. While the figures show only one MOS device, those skilled in the art understand that the process disclosed herein can be used to form multiple transistors including pluralities of NMOS, PMOS and bipolar devices (see FIG. 27).

Figure 9:
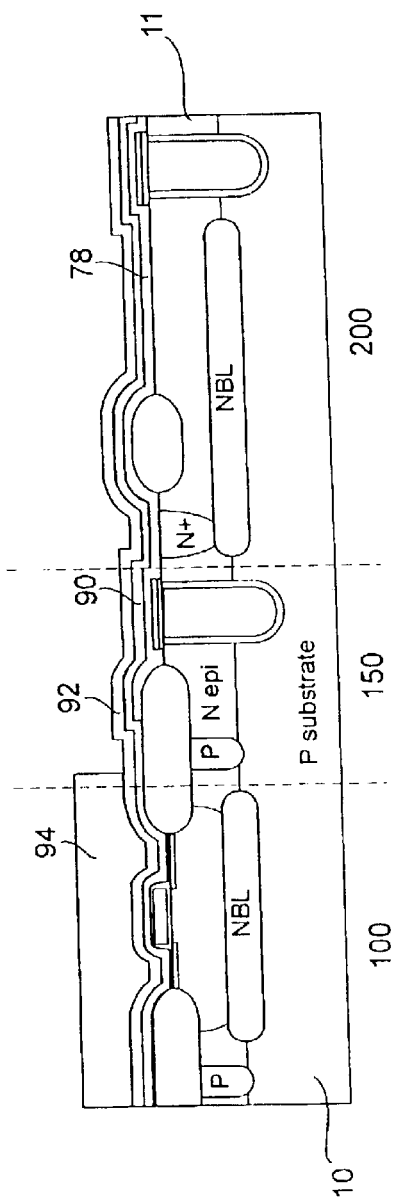

Having completed the formation of the CMOS transistors, the process protects the CMOS transistors while fabricating the NPN transistors. As a first step, a CMOS nitride etch stop protection layer 90, as shown in FIG. 9, is uniformly deposited over epitaxial layer 11. On top of the nitride protection layer, there is deposited a CMOS oxide protection layer 92. Since the two protection layers can be selectively etched with respect to each other, the combination of deposited layers in two sequential steps saves a substantial number of future process steps by using the two layers as different etch stops.

Figure 10:
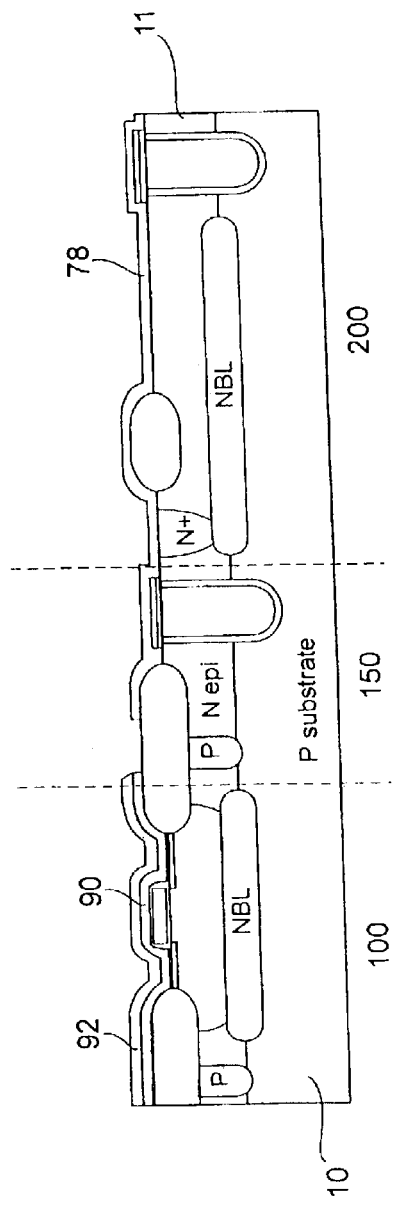

A photoresist layer 94 is deposited and patterned to cover the CMOS devices and at least part of the LOCOS region that extends from the transition region 150 into the CMOS region 100. The CMOS oxide protection layer 92 and nitride protection layer 90 are stripped from the exposed NPN region 200 using suitable wet etchings. As a result of sequential etching operations, the spacer oxide layer 78 is exposed as shown in FIG. 10.

Figure 11:
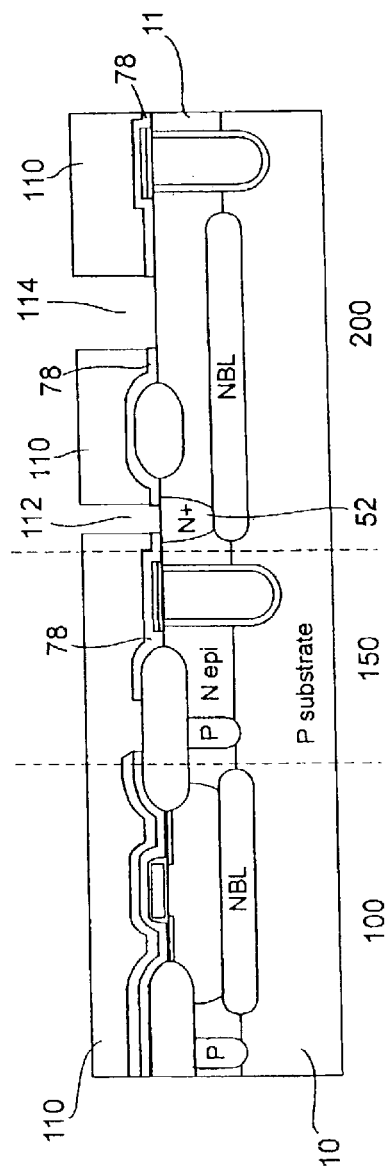

Turning to FIG. 11, a photoresist layer 110 is uniformly deposited over spacer oxide layer 78 and patterned to have openings 112 and 114 in the NPN section 200. With the photoresist 110 in place, the spacer oxide in exposed regions 112 and 114 is removed in order to expose the surface of the sinker diffusion 52 and the surface of the subsequent NPN transistor 200.

Figure 12:
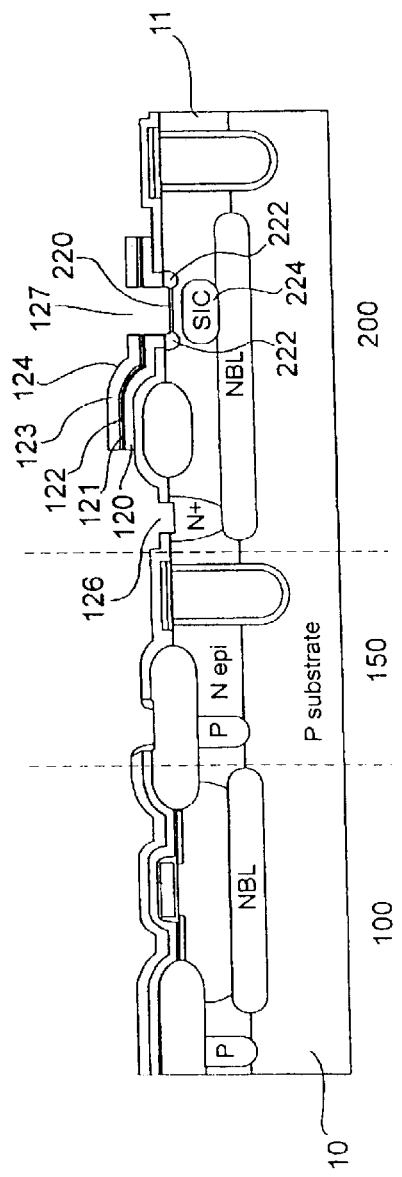

In the formation of the NPN transistor, the process forms the extrinsic base first, then the intrinsic base, and finally the emitter. The extrinsic base comprises a stack of layers that are deposited on the epitaxial layer 11. Turning to FIG. 12, these layers include a doped polysilicon layer 120, a tungsten suicide layer 121, a polysilicon cap layer 122, an inter-poly oxide layer 123 and a titanium nitride anti-reflective coating 124. The polysilicon layer 120, WSi layer 121 and polysilicon cap layer 122 are deposited followed by an implant of boron that will form the doping for the extrinsic base 222. The polysilicon cap layer is included to prevent the boron doping from segregating heavily at the top of the poly/WSi layer and not adequately diffusing into the silicon to create the extrinsic base. It also prevents unwanted sputtering of the WSi layer during the boron implant, which could potentially contaminate the implant tool with heavy metallics.

The stack is suitably patterned to form the emitter opening 127. As a result of thermal processing, dopants from layer 20 form the extrinsic base 222. A further boron implant through the emitter opening forms the intrinsic base 220. With the patterning mask for the stack still in place, a SIC (Selectively Implanted Collector) implant 224 is also made through the intrinsic base 220 and the emitter hole 127. The stack pattern mask helps mask the high energy SIC implant and creates a perfect self-alignment of the SIC to the transistor. The SIC implant 224 contacts the N+ buried layer 12.2. The SIC implant 224 is annealed, the emitter surface is oxidized and a P-type implant completes the intrinsic base 220.

Figure 13:
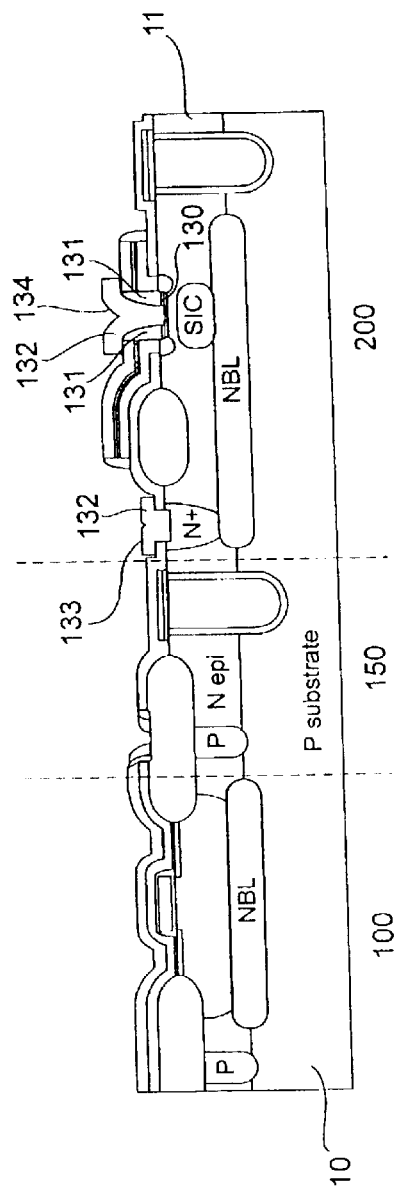

Turning to FIG. 13, a layer of base spacer oxide 130 is deposited to mask the base region. A nitride spacer layer 131 is deposited and etched to open the emitter region. The base spacer oxide is etched with suitable hydrofluoric acid. The structure of the composite spacer allows the emitter-to-extrinsic-base spacing, and hence, speed-versus-breakdown device tradeoffs, to be varied easily by changing the nitride spacer deposition thickness, the base spacer oxide etch time, or both. Next, an emitter polysilicon layer 132 is deposited and patterned to form the emitter contact 134 and the collector contact 133. In a subsequent annealing operation (see FIG. 17), the N-type dopants from the emitter poly layer 132 diffuse into the surface of the epitaxial layer 11 in order to form the collector surface contact and the emitter of the NPN transistors 200.

Figure 14:
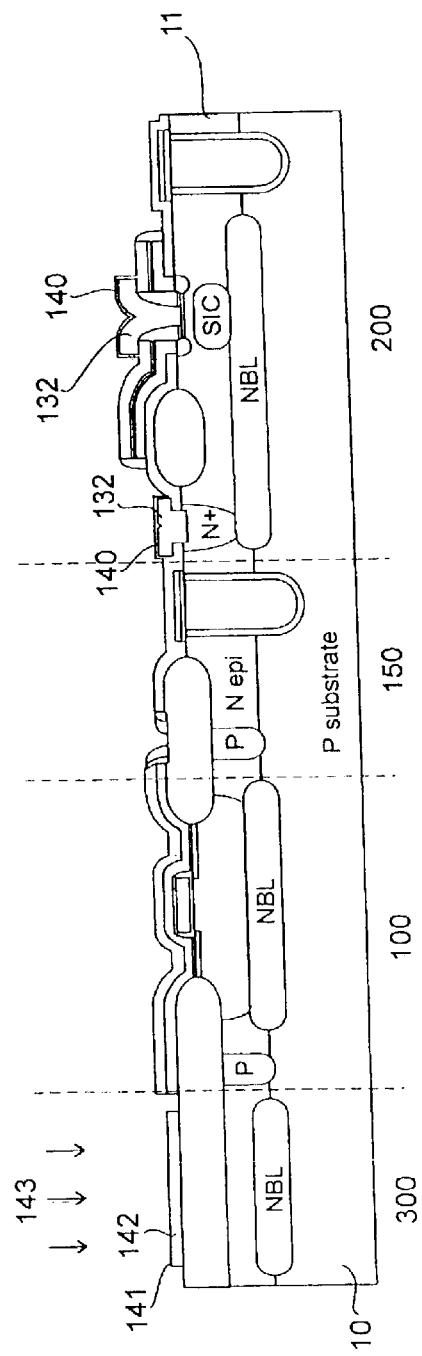
Figure 15:
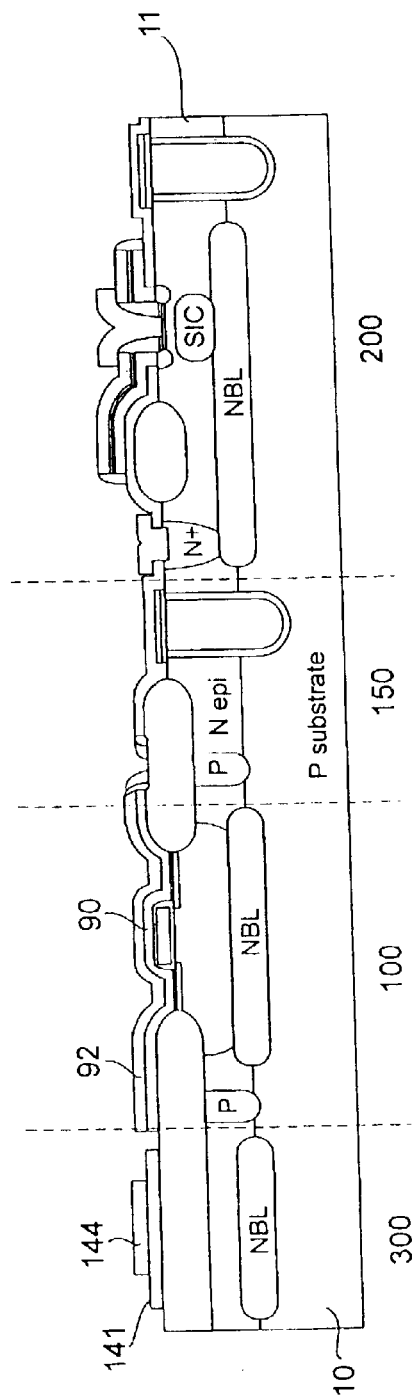

FIGS. 14 and 15 show the formation of the polysilicon resistor with a relatively low temperature coefficient of resistance (TCRL) resistor 141 in a resistor region 300. As a first step, a protective oxide 140 is deposited over the emitter polysilicon layer 132. This layer protects any exposed emitter polysilicon layer 132 from etching when the TCRL regions are defined. A polysilicon layer 142 is deposited in the opening. Next, the polysilicon layer is implanted with a $BF_2$ implant 143. Finally, the TCRL 141 is covered with a photoresist and etched to its suitable size. As shown in FIG. 15, the TCRL layer 141 is then covered with a protective oxide 144. The oxide is suitably patterned and masked to protect the underlying portion of the TCRL 141, while uncovering the contact regions of the resistor. It will be noted that the TCRL poly layer is deposited late in the process. As such, it is possible to deposit an amorphous silicon film and then adjust its resistivity by adding dopants.

This process of the invention forms a TCRL resistor 141 that has a resistance of 750 ohms per square and a temperature coefficient of resistance that is less than 100 parts per million (ppm). The resistor is formed using a non-selective $BF_2$ implant to dope the polysilicon layer. A 900° C. rapid thermal annealing (RTA) step activates the resistor implant and sets the final doping profiles for the bipolar and MOS devices 200, 100. It will be noted that a TCRL poly layer is deposited late in the process. The invention's process deposits an amorphous silicon film and then adjusts its resistivity by adding dopants. A non-selective $BF_2$ implant is used to dope the film. A mask is used to clear oxide from all contact areas and a 900° C. RTA step activates resistor implants to set the final doping. Resistor contacts are consequently silicided before final back end processing.

The TCRL resistor 141 separates the resistance from temperature sensitivity. In the prior art, it was assumed that high resistivity resulted in a greater temperature sensitivity. Antecedents to the inventive process attempted to separate those two characteristics by providing a relatively thin film with dopings adjusted to set the resistivity to 750 ohms per square. As $BF_2$ implants approach a high level, an unanticipated and counter-intuitive increase in resistance was observed. This behavior was not observed when only boron was used to dope this film. Normal expectations were that higher implant levels would decrease resistance, not increase it. It appears that the heavier ion ($BF_2$) in high doses creates a large amount of damage in the polysilicon film and that this damage cannot be annealed at a relatively low temperature (900° C.) with short thermal annealing (RTA) to activate the implants. The implant damage apparently creates additional trapping sites for carriers resulting in increased resistance at higher implant doses. It is believed that co-implantation of other ions could produce similar results making it possible to use the same high dose boron implant to produce even higher value resistors as well as emitters for PNP's or low resistivity extrinsic bases for NPN's or the sources and drains of MOS devices. In our preferred embodiment, the polysilicon layer 142 has a thickness of 70 nm and may be in a range of from 65 nm to 75 nm. The implant concentration of boron ions 142 is $1.3 \times 10^{16}$ and may be in a range from $9 \times 10^{15}$ to $1.5 \times 10^{16}$.

Early in the invention's development, three film thicknesses with a medium boron dose were chosen for evaluation. As shown in table 1, the thinnest film came the closest to the objective of 750 ohms per square. However, the TCRs of all cells were above the goal of 100 ppm. A second set of tests left the film thickness at the thin setting and varied the implant dose over more than one decade with the expectation that the higher doses would result in lower sheet resistances and lower TCRs.

TABLE 1

| TCR/RS vs. Poly Thickness | | |
|---|---|---|
| Poly Th. | Rs | TCR |
| Thin | 650 | 228 |
| Med. | 532 | 238 |
| Thick | 431 | 292 |

At first, as indicated in FIG. 20, there was very little change in sheet resistance and TCR with increasing doses. However, as the implant levels started to approach the highest levels, an unanticipated increase in resistance was observed while the TCRs experienced a sharp decline until they became negative at the highest dose.

Yamaguchi, et al. [Yamaguchi, et al., "*Process and Device Characterization for a 30-GHz ft Submicrometer Double Poly-Si Bipolar Technology Using BF2-Implanted Base with Rapid Thermal Process*", IEEE TED, August 1993.] observed the same relationship between TCR and sheet resistance. In this study, TCRs of boron-doped P-type polysilicon resistors fabricated with a 150 nm amorphous layer approach zero at sheet resistances of 600–800 ohms per square. However, within the range of doses in the cited investigation, resistance declines with increasing boron doses.

In a parallel experiment aimed at lowering TCR, boron and boron plus another species ($BF_2$) were implanted into a medium thickness film. The implant energies were adjusted to compensate for the different ranges of the species. The results, once again, were quite unexpected: the average resistance of the boron by itself was 200 ohms per square with a TCR of 445 ppm while the values for the $BF_2$ resistors were 525 and 221 respectively.

Based on these results, it is believed that the heavier ion and the extremely high doses create a large amount of damage in the polysilicon film which cannot be annealed by the relatively short 900° C. RTA. This damage creates additional trapping sites for the carriers resulting in increased resistance at higher implant doses. Therefore, it is believed that co-implantation of other ions could produce similar results thus making it possible to use the same high dose boron implant to produce high value resistors as well as the emitters for PNPs or low resistivity extrinsic bases for NPNs or the sources and drains of MOS devices.

Table 2 shows the effects of RTA temperature on sheet resistance and TCR as a function of implant dose. Once again, the higher sheet resistances obtained with the lower temperature yield reduced TCRs except at the lower dose where a resistance of 763 results in a TCR of 168.

This lends support to the theory that damage is a major part of the previously observed TCR behavior. The lower RTA temperature leads to suppressed carrier activation and higher sheets. Concurrently, there is less annealing of the implant damage. However, at the low dose, there is insufficient implant damage to degrade carrier mobility to the point where it becomes less sensitive to the temperature variations.

TABLE 2

TCR/RS vs. RTA Temp

| Dose | Rs | TCR | RTA |
|------|-----|-----|--------|
| Low  | 637 | 293 | 900 C. |
| Low  | 763 | 168 | 800 C. |
| Med. | 628 | 271 | 900 C. |
| Med. | 849 | 76  | 800 C. |
| High | 726 | 90  | 900 C. |
| High | 832 | 22  | 800 C. |

Characterization Results

FIG. 21 is a scatter plot of a 30×30 micron resistor showing the relationship of TCR to sheet resistance at 50° C. was chosen as the lowest measurement point. The TCR is calculated by fitting a line to values measured from 50–125° C. at 25° intervals. The dashed lines denote the objectives that were set for this development project.

Parts from two different runs were packaged and measured from −50 to 150° C. FIG. 22 shows average changes in sheet resistance for nine parts measured over this temperature range while FIG. 23 is a plot of the calculated TCRs for this set of measurements. The solid line represents a linear fit while the dashed line is a polynomial fit. The upward "hook" observed at lower temperature is typical to that of diffused resistors.

Since matching is of particular interest to analog and mixed signal designers, FIG. 24 shows the percent mismatch as a function of length for a fixed width resistor and FIG. 25 represents the same parameter as a function of width with a fixed length. The data, as expected, show improved matching with increasing dimensions.

The feasibility of fabricating a high value polysilicon resistor with low TCR has been demonstrated. The investigation has uncovered a relationship between ion species, sheet resistance and TCR which can result in reduced process complexity Since 800° C. RTA is a benign temperature for present bipolar processes, it is possible if desired to de-couple the resistor activation step from the RTA used to set the device electrical parameters.

Figure 16:
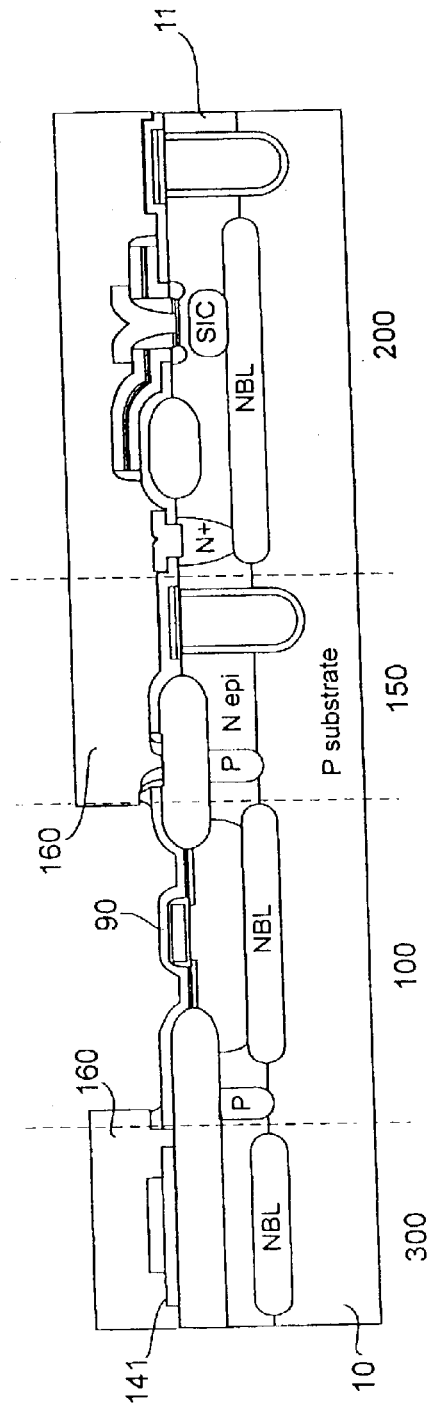

With the Bipolar and TCRL components processed to this point, it is now appropriate to remove the protection layers from the CMOS portions of the wafer so that the remaining metalization operations can be performed on all devices. Turning next to FIG. 16, the TCRL resistor 141 and the NPN transistor regions 200 are protected with a layer of photoresist 160. The photoresist is patterned to open a region above the CMOS devices 100. Next, the protective oxide 92 (FIG. 15) is removed.

Figure 17:
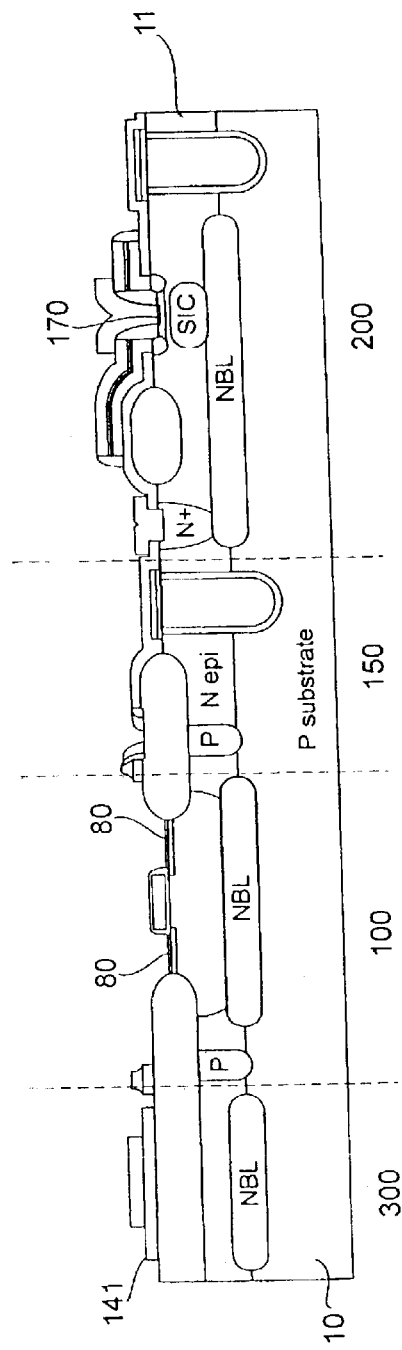

Now refer to FIG. 17. The photoresist layer 160 is removed, followed by removal of the nitride protect layer 90. At this time, the emitter 170 and the resistor 141 are subjected to an RTA step. The step is carried out at approximately 900° C. for 0.5 minutes, and completes the fabrication of the emitter first prepared in the steps shown previously in FIG. 13.

Figure 18:
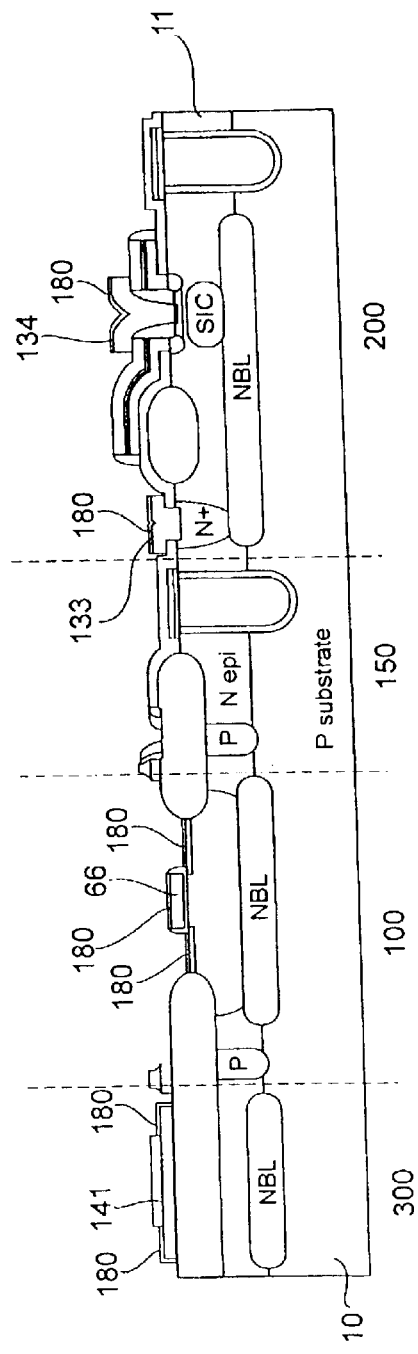
Figure 19:
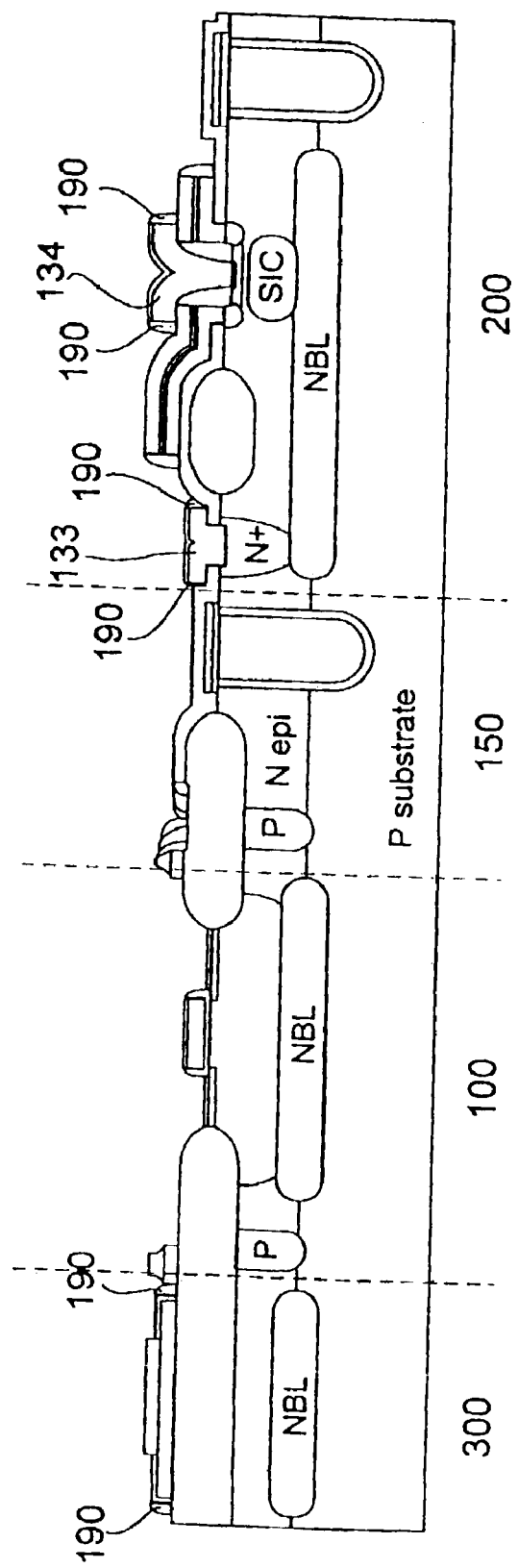
Figure 26:
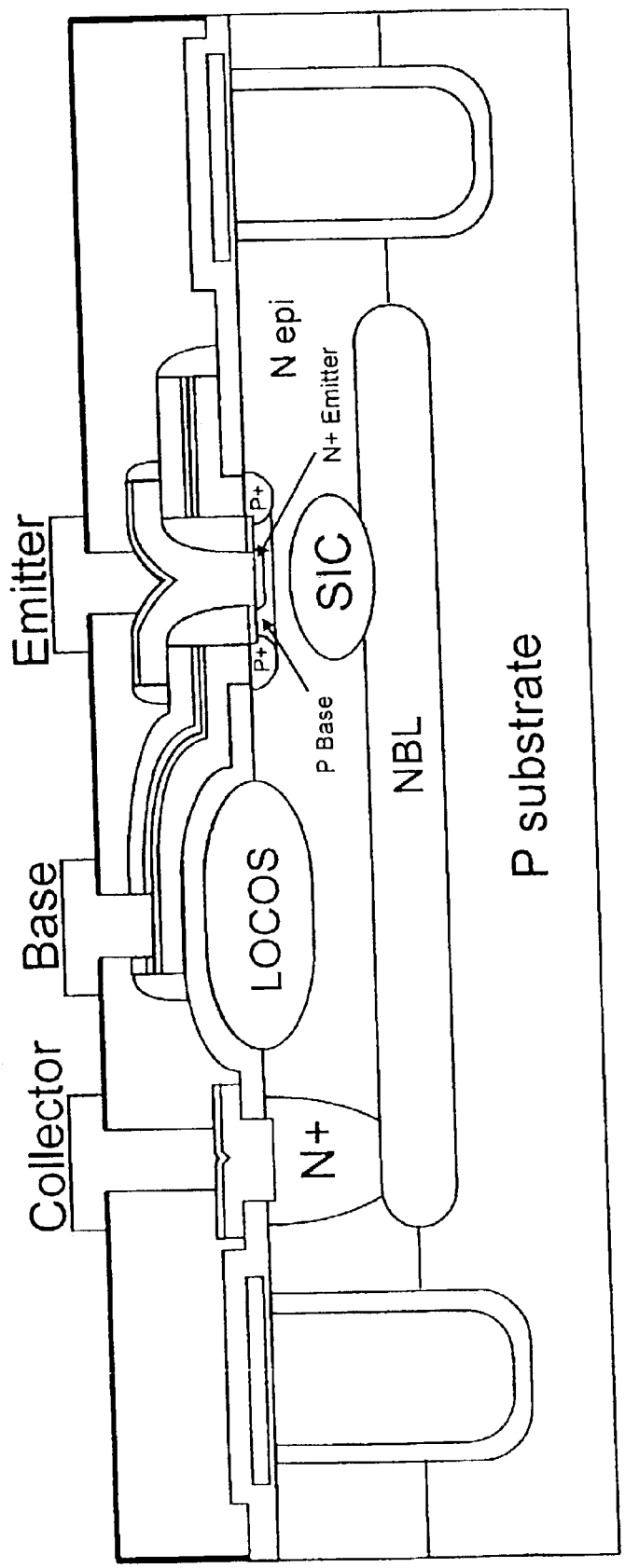
FIG. 26 shows a more-detailed cross-section of the NPN bipolar device formed in the invention's BiCMOS process.

The screen oxide layer 80 over the lightly doped source and drain regions of the CMOS device is then removed. As shown in FIG. 18, the exposed polysilicon regions of the resistor 141, the gate 66, the source and drain regions, and the collector and emitter contacts 133, 134 are silicided with platinum 180 to form a platinum silicide layer on the exposed polysilicon. As shown in FIG. 19, a sidewall spacer oxide 190 is applied to the sidewalls of the emitter contact 134 and the collector contact 133. The rest of the spacer oxide is etched and removed. Thereafter, the substrate is subjected to suitable metallization layers, including the formation of three metal layers separated from each other by suitable insulating layers and separate layers being selectively interconnected, one to the other, by the formation of vias that are filled with conductive material. After metallization the entire device is covered with a passivation layer, typically silicon nitride, and a substrate including the integrated circuits and devices made thereon are then further processed for testing and assembly.

Having thus disclosed preferred embodiments of the invention, those skilled in the art will appreciate that further modifications, changes, additions and deletions may be made to that embodiment without departing from the spirit and scope of the appended claims.

What is claimed is:

1. A process for making a polysilicon precision resistor in an integrated circuit comprising the steps of:

depositing an insulation layer on the integrated circuit;

depositing a polysilicon layer on the insulation layer;

implanting ions into the polysilicon layer to change the resistance of the polysilicon and to damage the polysilicon layer; and annealing the polysilicon layer to reduce temperature coefficient of the resistance of the polysilicon resistor by rapid thermal annealing.

2. The method of claim 1, wherein the annealing temperature ranges from approximately 800 degrees C. to 900 degrees C.

3. The method of claim 1, wherein the implant energy of the ions ranges from 10 to 3.5 KeV.

4. The method of claim 1, wherein the thickness of the polysilicon layer ranges from 65 nm to 75 nm.

5. The method of claim 1, wherein two or more specks of ion are implanted into the polysilicon.

6. The method of claim 1, wherein boron is one of the species.

7. A method of making a resistor in an integrated circuit, the method comprising:
   forming an insulation layer overlaying a substrate of the integrated circuit;
   forming a polysilicon layer overlaying the insulation layer;
   implanting a relatively high concentration of dopants of one or more species in a in the polysilicon layer; and
   annealing the substrate for a relatively short period of time so that a substantial amount of unannealed implant damage remains in the polysilicon layer.

8. The method of claim 7, wherein forming the insulation layer further comprises:
   depositing a silicon nitride layer overlaying the substrate; and
   patterning the silicon nitride layer to expose local oxidation regions.

9. The method of claim 7, wherein the insulation layer is formed from silicon dioxide.

10. The method of claim 7, wherein the insulation layer is formed from silicon nitride.

11. The method of claim 7, wherein annealing the substrate, further comprises:
    performing a rapid thermal annealing at relatively low temperature of approximately 800° C. to 900° C.

12. The method of claim 7, wherein implanting dopants of one or more species in the polysilicon layer include implanting boron and fluorine ions.

13. The method of claim 7, wherein the resistor is formed to have a temperature coefficient of resistance that is less than 100 parts per million.

14. The method of claim 7, further comprising:
    forming a layer of protective oxide overlaying the polysilicon layer.

15. The method of claim 7, wherein implanting dopants of one or more species in the polysilicon layer includes implanting boron ions.

16. The method of claim 8, wherein the concentration of boron ions is approximately in the range of $9 \times 10^{15}$ to $1.5 \times 10^{16}$.

17. A method of forming an integrated circuit comprising:
    forming one or more transition regions in a substrate to isolate MOS regions from bipolar regions in the substrate;
    forming a MOS device in each MOS region of the substrate;
    forming a bipolar device in each bipolar region of the substrate;
    forming local oxidation (LOCOS) regions adjacent the surface of the substrate;
    forming at least one polysilicon layer overlaying an associated LOCOS region;
    implanting a relatively high concentration of dopants of one or more species in a in the polysilicon layer; and
    annealing the substrate for a relatively short period of time so that a substantial amount of unannealed implant damage remains in the polysilicon layer thereby forming a polysilicon resistor with a relatively low temperature coefficient of resistance.

18. The method of claim 17, wherein the polysilicon layer has a thickness approximately ranging between 65 nm to 75 nm.

19. The method of claim 17, wherein the polysilicon resistor has a sheet resistance ranging approximately between 725 ohms/square to 850 ohms/square.

20. The method of claim 17, wherein the polysilicon resistor has a temperature coefficient of resistance (TCR) approximately ranging between 20 to 100 parts per million.

21. The method of claim 17, wherein the annealing of substrate also anneals emitters of bipolar devices.

22. The method of claim 17, wherein the annealing is carried out at approximately 900° C. for 0.5 minutes.

23. The method of claim 17, Further comprising:
    forming buried layers in select MOS regions and select bipolar regions, wherein at least one of the buried layers has a different diffusion coefficient than the other buried layers.

24. The method of claim 23, Further comprising:
    forming wells of a select conductivity type between select LOCOS regions associated with the MOS devices in forming PMOS and NMOS devices, each well extending from a surface of the substrate to an associated buried layer, wherein the select LOCOS regions providing surface lateral isolation between the PMOS and NMOS devices.

25. The method of claim 24, further comprising:
    forming a P-type conductivity implant under the select LOCOS regions to provide junction isolation between the PMOS and NMOS devices.

26. The method of claim 23, further comprising:
    forming a sinker diffusion in each bipolar region, each sinker diffusion extending from a surface of the substrate to an associated buried layer, wherein a select LOCOS region is used to separate each sinker diffusion from the rest of an associated bipolar device formed in the bipolar region.

27. The method of claim 26, further comprising:
    forming an intrinsic base in each bipolar region, the intrinsic base being separated from an associated sinker diffusion by an associated LOCOS region; and
    implanting a selectively implanted contact (SiC) through the intrinsic base, wherein the SiC is in contact with an associated bailed layer.

28. The method of claim 17, further comprising:
    forming a protective oxide layer overlaying the poysilicon layer; and
    pattering the protective layer to uncover contact regions of the polysilicon resistor.

29. The method of claim 28, further composing:
    forming a platinum silicide layer overlaying the contact regions.

30. The method of claim 29, wherein the platinum layer is further formed over gate, source and drain contact regions of MOS devices and collector and emitter contact regions of bipolar devices at the same time the platinum layer is formed over the contact regions.

31. A method of making a resistor in an integrated circuit, the method comprising:
    forming an insulation layer overlaying a substrate of the integrated circuit;
    forming a polysilicon layer overlaying the insulation layer;
    implanting a relatively high concentration of dopants of one or more species in the polysilicon layer; and applying a rapid thermal annealing to activate the implant in the polysilicon layer to achieve a relatively low temperature coefficient in the resistor.

32. The method of claim 31, wherein forming the insulation layer further comprises:

depositing a silicon nitride layer overlaying the substrate; and patterning the silicon nitride layer to expose local oxidation regions.

33. The method of claim 31, wherein the insulation layer is formed from silicon dioxide.

34. The method of claim 31, wherein the insulation layer is formed from silicon nitride.

35. The method of claim 31, further comprises:

applying the rapid thermal annealing at a relatively low temperature of approximately 800° C. to 900° C.

36. The method of claim 31, wherein implanting dopants of one or more species in the polysilicon layer include implanting boron and fluorine ions.

37. The method of claim 31, wherein the resistor is formed to have a temperature coefficient of resistance that is less than 100 parts per million.

38. The method of claim 31, further comprising:

forming a layer of protective oxide overlaying the polysilicon layer.

39. The method of claim 31, further comprising:

siliciding resistor contacts.

40. The method of claim 31, wherein implanting dopants of one or more species in the polysilicon layer includes implanting boron ions.

41. The method of claim 40, wherein the concentration of boron ions is approximately in the range of $9 \times 10^{15}$ to $1.5 \times 10^{16}$.

* * * * *

UNITED STATES PATENT AND TRADEMARK OFFICE
CERTIFICATE OF CORRECTION

PATENT NO.        : 6,812,108 B2
APPLICATION NO. : 10/393181
DATED             : November 2, 2004
INVENTOR(S)      : Hemmenway et al.

Page 1 of 1

It is certified that error appears in the above-identified patent and that said Letters Patent is hereby corrected as shown below:

At Claim 5, Column 9, Line 3, please replace "specks" with --species--

At Claim 7, Column 9, Line 14, please delete "in a"

At Claim 17, Column 9, Line 62, please delete "in a"

At Claim 23, Column 10, Line 14, please replace "Further" with --further--

At Claim 24, Column 10, Line 19, please replace "Further" with --further--

At Claim 27, Column 10, Line 43, please replace "SiC' with --SIC--

At Claim 27, Column 10, Line 44, please replace "SiC" with --SIC--

At Claim 28, Column 10, Line 49, please replace "pattering" with --patterning--

At Claim 35, Column 11, Line 17, please delete "." after "800° C"

Signed and Sealed this

Thirtieth Day of October, 2007

JON W. DUDAS
*Director of the United States Patent and Trademark Office*